(12) United States Patent
Hubbard

(10) Patent No.: US 7,046,570 B1
(45) Date of Patent: May 16, 2006

(54) PROGRAMMABLE LOGIC DEVICES OPTIONALLY CONVERTIBLE TO ONE TIME PROGRAMMABLE DEVICES

(75) Inventor: John R. Hubbard, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/860,241

(22) Filed: Jun. 2, 2004

(51) Int. Cl.
*G11C 7/00* (2006.01)

(52) U.S. Cl. ............... 365/225.7; 365/185.04; 365/185.29; 365/195; 365/196

(58) Field of Classification Search ........... 365/185.29, 365/218, 225.7, 195, 196, 185.04
See application file for complete search history.

(56) References Cited

U.S. PATENT DOCUMENTS

| | | | |
|---|---|---|---|
| 6,102,963 A | 8/2000 | Agrawal | |
| 6,137,308 A | 10/2000 | Nayak | |
| 6,363,019 B1 | 3/2002 | Erickson et al. | |
| 6,507,213 B1 | 1/2003 | Dangat | |
| 6,556,479 B1 * | 4/2003 | Makuta et al. | 365/185.09 |
| 6,560,665 B1 | 5/2003 | Resler et al. | |
| 6,873,177 B1 | 8/2003 | Wennekamp et al. | |

OTHER PUBLICATIONS

U.S. Appl. No. 10/860,241, filed Jun. 2004, Hubbard, John R.*

* cited by examiner

*Primary Examiner*—Richard Elms
*Assistant Examiner*—Pho M. Luu
(74) *Attorney, Agent, or Firm*—Lois D. Cartier

(57) ABSTRACT

Programmable logic devices (PLDs) that can be repeatedly erased and reprogrammed, e.g., during the testing and/or design phases, and then converted to one-time programmable (OTP) devices on a permanent basis, and methods of converting a PLD to an OTP device. In some embodiments, only the erase function is disabled in the device. Because programming data cannot then be erased from the device, the addition of new programming data is very unlikely to yield an operable design. Therefore, the programming function is also effectively disabled. The programming function can be directly disabled in addition to or instead of the erase function, if desired. The erase and/or programming functions can be disabled, for example, by blowing one or more fuses included in the erase and/or programming circuitry of the PLD.

32 Claims, 8 Drawing Sheets

PROGRAMMABLE LOGIC DEVICES OPTIONALLY CONVERTIBLE TO ONE TIME PROGRAMMABLE DEVICES

FIELD OF THE INVENTION

The invention relates to programmable logic devices (PLDs). More particularly, the invention relates to a PLD that can be erased and reprogrammed repeatedly as desired, then optionally converted to a one time programmable (OTP) device on a permanent basis.

BACKGROUND OF THE INVENTION

Programmable logic devices (PLDs) are a well-known type of integrated circuit that can be programmed to perform specified logic functions. One type of PLD is the Complex Programmable Logic Device, or CPLD. A CPLD typically includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, programming data is stored on-chip in non-volatile memory. In some CPLDs, programming data is stored on-chip in non-volatile memory, then downloaded to volatile memory as part of an initial programming sequence.

FIG. 1 is a simplified illustration of an exemplary CPLD. A CPLD typically includes two or more logic blocks (LBs 101a–101h) connected together and to input/output blocks (I/Os 102a–102f) by a programmable interconnection array (103). The interconnection array includes many multiplexer circuits 105, each including several programmable interconnect points (PIPs) 104. In each multiplexer circuit 105, only one PIP 104 is enabled. The enabled PIP selects one of the many input signals provided to the interconnection array, and the selected input signal is provided as the output signal from the multiplexer circuit 105.

Many PLDs that store data in non-volatile memory, including many CPLDs, provide the capability of erasing programming data previously stored in the device, and replacing the programming data with a new data stream. For example, the use of FLASH memory to store the programming data renders a PLD reprogrammable. This capability can be extremely useful, for example, in testing the PLD prior to sale. Many different configurations can be programmed into the device, and functionality can be verified in many different ways. The programming data used for testing can then be erased, and the PLD can be sold as a reprogrammable PLD.

However, there are applications in which reprogrammability is a drawback. For example, in a slot machine, the ability to reprogram a PLD might render the slot machine vulnerable to tampering, e.g., with the objective of changing the pay out rate. For this type of application, "one time programmable" (OTP) devices are sometimes preferred. An OTP device can be programmed only once. Once the device is programmed with a first set of programming data, the device cannot be reprogrammed and the programming data cannot be erased. One way of implementing an OTP device is to use fuse structures. Once a fuse is blown, the nodes on either side of the fuse cannot be reconnected. Therefore, the programming is permanent. Mask programmable gate arrays provide another type of OTP device. Mask programmable gate arrays are also relatively inflexible, being permanently "programmed" during fabrication.

Clearly, a manufacturer cannot test an OTP device by repeatedly programming the devices with different configurations, as is normal procedure with reprogrammable PLDs. Therefore, an OTP device can only be fully tested after programming, e.g., by a user implementing a user design in the OTP device. A certain percentage of these devices will fail the tests, possibly necessitating further tests to determine the source of the problem so the user can be reimbursed for faulty devices. Therefore, it is desirable to provide circuits and methods that enable the testing of OTP devices more fully prior to programming the devices with the permanent configuration.

Another drawback of known OTP devices is that a design cannot be debugged by making alterations to the design as errors become apparent, and loading the altered design back into the device, because the design programmed into the OTP device is permanently fixed. Therefore, it is desirable to provide circuits and methods for OTP devices that enable the alteration of a design programmed into the device during a debug phase for the design.

SUMMARY OF THE INVENTION

The invention provides programmable logic devices (PLDs) that can be repeatedly erased and reprogrammed, e.g., during the testing and/or design phases, and then converted to one-time programmable (OTP) devices on a permanent basis. For example, a PLD can be converted to an OTP device after the PLD testing is complete, or after a design implemented in the PLD has been finalized.

In some embodiments, only the erase function is disabled in the device. Because programming data cannot then be erased from the device, the addition of new programming data is very unlikely to yield an operable design. Therefore, the programming function is also effectively disabled. However, in some embodiments the programming function is directly disabled in addition to or instead of the erase function. The erase and/or programming functions can be disabled, for example, by blowing one or more fuses included in the erase and/or programming circuitry of the PLD.

The invention also encompasses methods of converting a PLD to an OTP device on a permanent basis.

BRIEF DESCRIPTION OF THE DRAWINGS

The present invention is illustrated by way of example, and not by way of limitation, in the following figures.

DETAILED DESCRIPTION OF THE DRAWINGS

Figure 1:
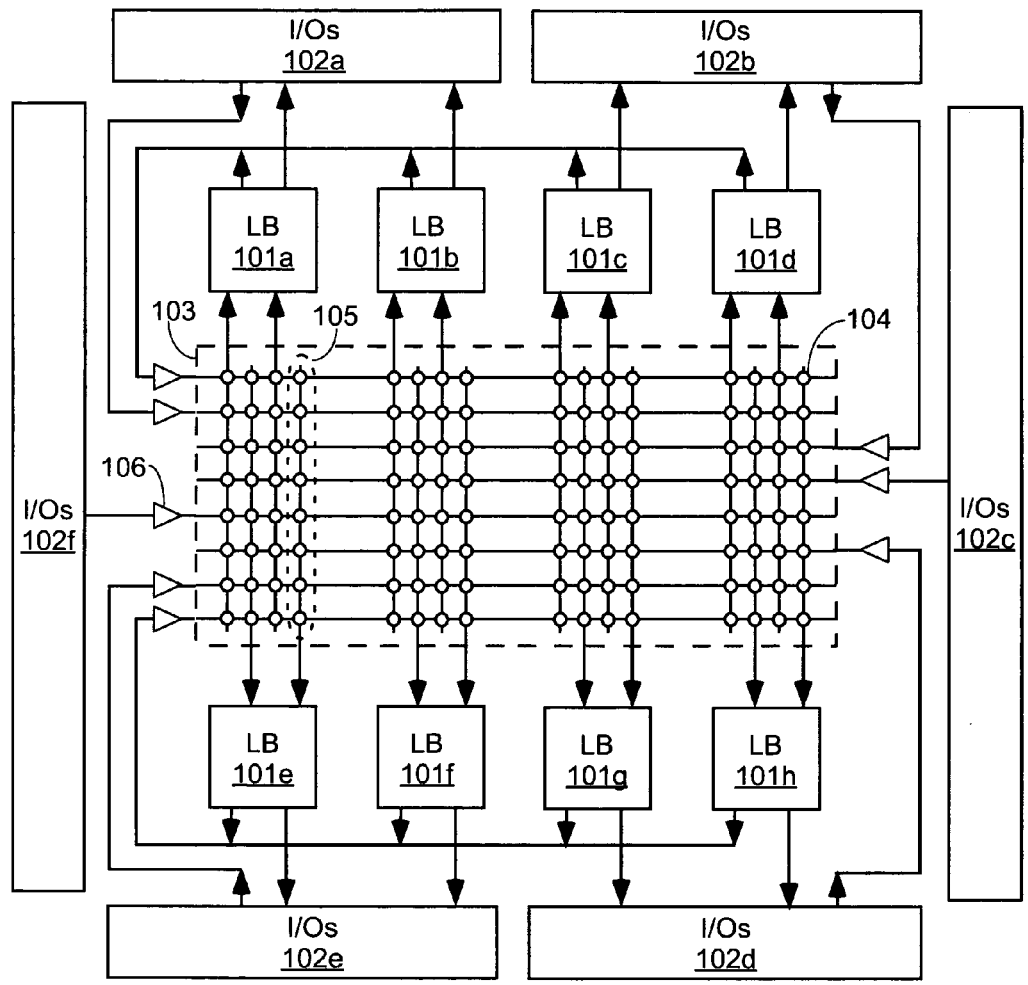
FIG. 1 is a simplified diagram of a well known complex programmable logic device (CPLD) architecture.

The present invention is applicable to a variety of programmable logic devices (PLDs) in which programming data is stored in non-volatile memory. The present invention has been found to be particularly applicable and beneficial for complex programmable logic devices (CPLDs) such as the CPLD illustrated in FIG. 1. While the present invention is not so limited, an appreciation of the present invention is presented by way of specific examples that can be applied, for example, to such a CPLD.

Figure 2:
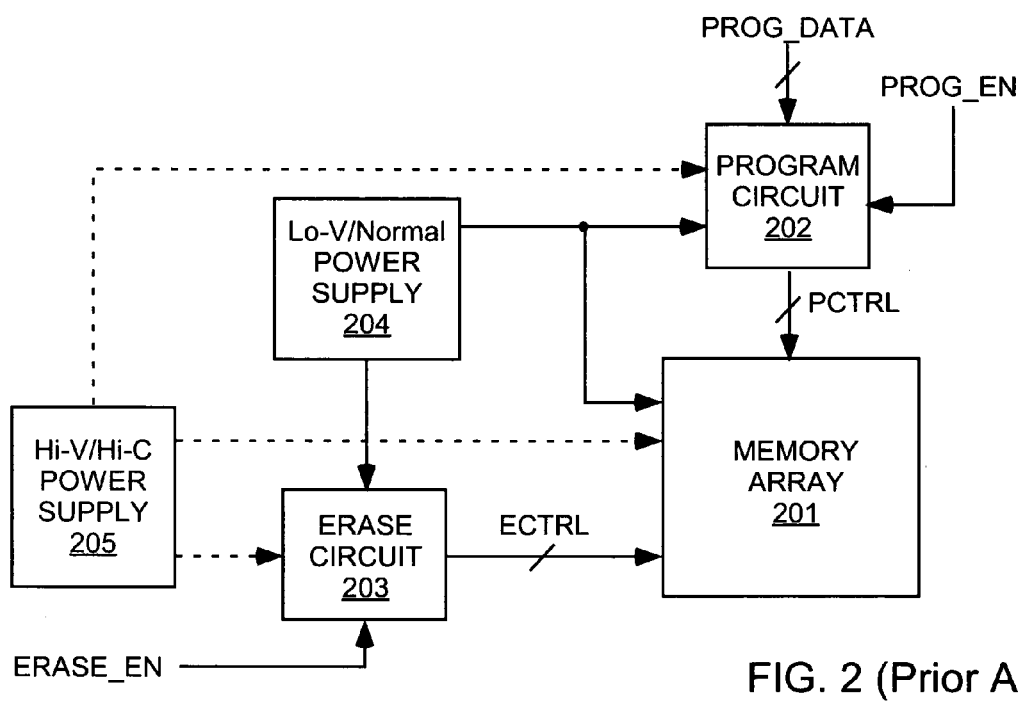
FIG. 2 is a block diagram of a well known programmable logic device (PLD).

FIG. 2 is a block diagram of a well known PLD, illustrating program and erase function blocks as well as a non-volatile memory array. Non-volatile memory array 201 is programmed with program data PROG_DATA via program circuit 202, using program control signals PCTRL. (In the present specification, the same reference characters are used to refer to terminals, signal lines, and their corresponding signals.) Program circuit 202 is in turn controlled by program enable signal PROG_EN. Data stored in memory array 201 can be erased by erase circuit 203, using erase control signals ECTRL. Erase circuit 203 is in turn controlled by erase enable signal ERASE_EN.

A low voltage ("normal") power supply 204 supplies program circuit 202, erase circuit 203, and memory array 201. A high voltage (high current) power supply 205 supplies the high voltage and/or high current signals used to perform the program and erase functions. High voltage power supply 205 is optionally applied directly to memory array 201, program circuit 202, and/or erase circuit 203, depending on the design of the CPLD circuitry. The optional connections are illustrated in FIG. 2 as a dotted line.

FIGS. 3–10 illustrate various embodiments of the present invention in which the erase and/or program functions of a PLD can optionally be disabled on a permanent basis. This disablement can be performed, for example, by "blowing" one or more fuses, or by otherwise physically destroying an electrical connection within the PLD. The permanence of this solution is particularly desirable in sensitive applications. While it has been proposed that programmable bits be used to disable the erase function in PLDs, this solution is not truly secure, because the bits can be reprogrammed to re-enable the erase function. Further, the bits controlling the erase function can emerge from the production process in an unpredictable state, and can even lose their programmed values over time. Therefore, the solutions described herein are preferable from a security standpoint.

Figure 3:
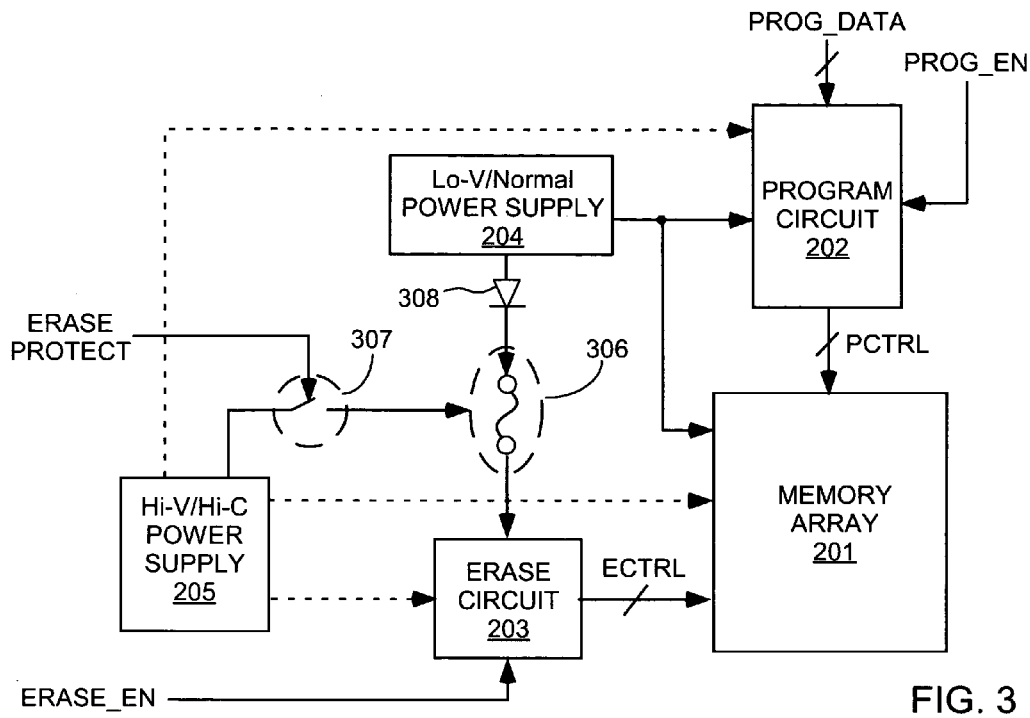
FIG. 3 illustrates a PLD according to one embodiment of the invention, in which the erase function can optionally be disabled using a fuse structure.

FIG. 3 illustrates a PLD according to one embodiment of the invention, in which erase circuit 203 can be optionally disconnected from low voltage power supply 204 on a permanent basis. The implementation of FIG. 3 includes all of the same elements as the PLD of FIG. 2, which are not again described, but a fuse structure is added. The fuse structure includes elements 306–308, and is coupled between low voltage power supply 204 and erase circuit 203. A reverse current connection diode 308 is coupled to low voltage power supply 204, and a fuse 306 is coupled between diode 308 and erase circuit 203. A switch 307 is coupled between high voltage power supply 205 and a control terminal of fuse 306, the switch being controlled by an erase protect signal ERASE PROTECT. Switch 307 can be implemented, for example, using an N-channel transistor or a CMOS pass gate, or using any other method compatible with the fabrication technology of the PLD. Fuse 306 can be implemented, for example, using any of several well-known techniques, such as those currently in use for fuse PLDs, or using other techniques yet to be developed.

Figure 4:
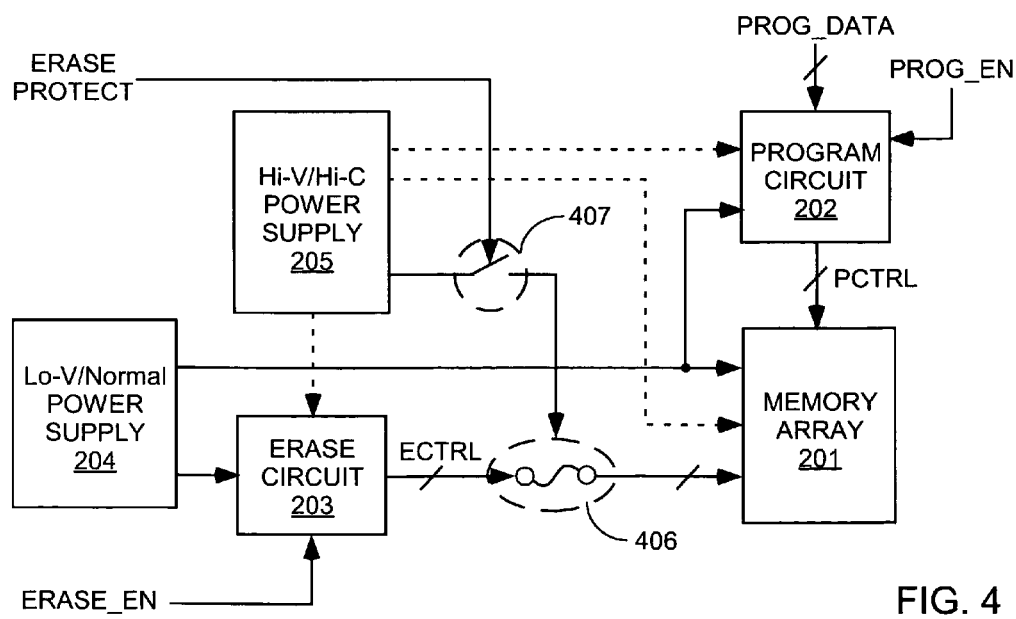
FIG. 4 illustrates a second PLD in which the erase function can optionally be disabled using a different fuse structure.

FIG. 4 illustrates a PLD according to another embodiment of the invention, in which control signals ECTRL coupling erase circuit 203 to memory array 201 can be optionally disconnected on a permanent basis. The implementation of FIG. 4 includes all of the same elements as the PLD of FIG. 2, which are not again described, but a new fuse structure is added. The fuse structure includes elements 406–407, and is coupled between erase circuit 203 and memory array 201. A switch 407 is coupled between high voltage power supply 205 and a control terminal of fuse 406, the switch being controlled by erase protect signal ERASE PROTECT. Switch 407 can be implemented, for example, using an N-channel transistor or a CMOS pass gate, or using any other method compatible with the fabrication technology of the CPLD. Fuse 406 can be implemented, for example, using any of several well-known techniques, such as those currently in use for fuse PLDs, or using other techniques yet to be developed.

Figure 5:
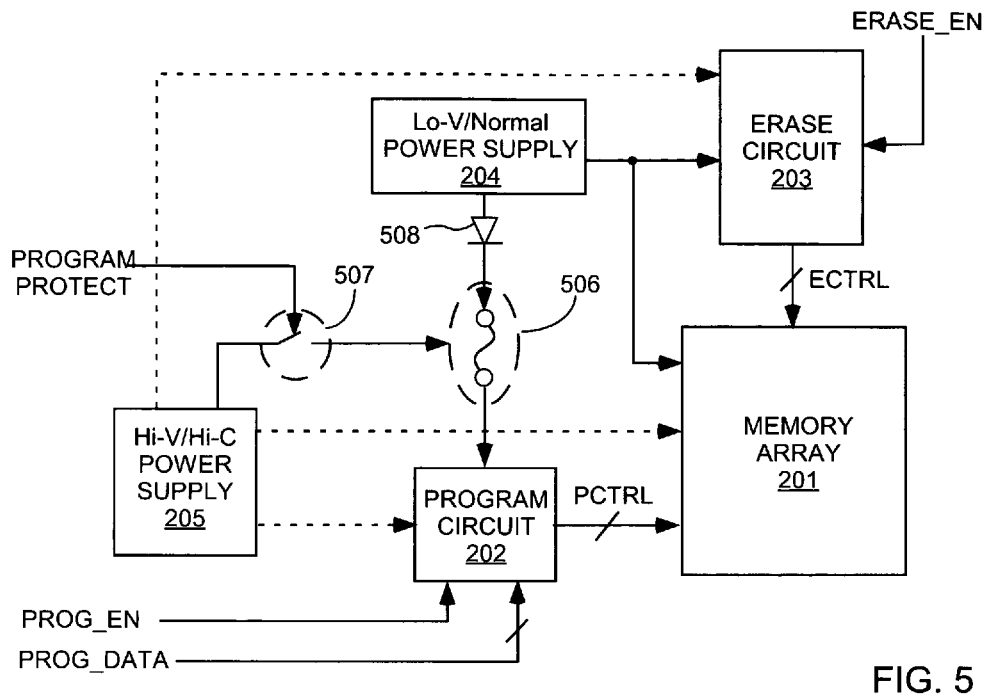
FIG. 5 illustrates a PLD according to one embodiment of the invention, in which the program function can optionally be disabled using a fuse structure.
Figure 6:
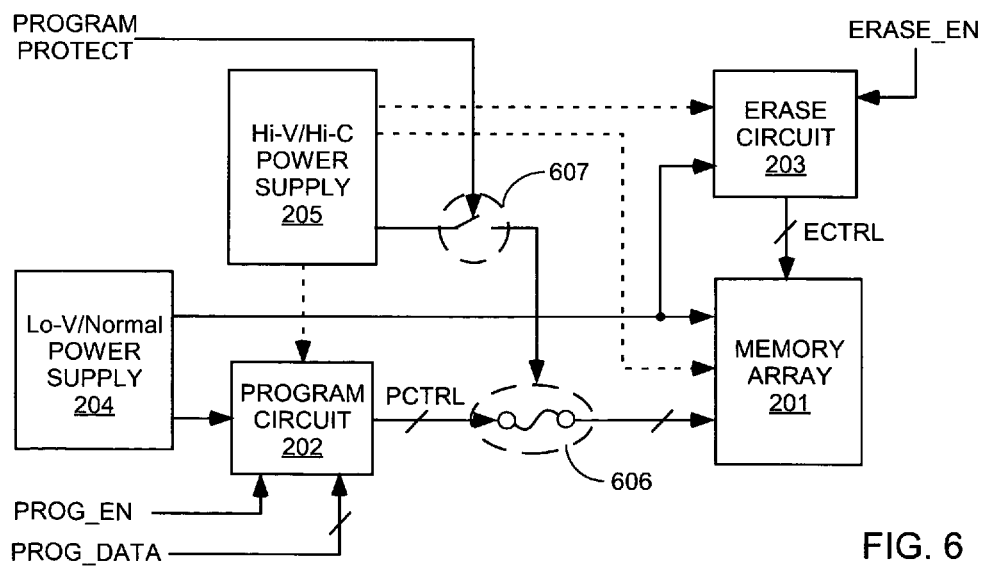
FIG. 6 illustrates a second PLD in which the program function can optionally be disabled using a different fuse structure.

In the embodiments of FIGS. 3 and 4, the erase function is optionally disabled in a permanent manner. In the embodiments of FIGS. 5 and 6, the program function is optionally disabled in a similar fashion.

FIG. 5 illustrates a PLD in which program circuit 202 can be optionally disconnected from low voltage power supply 204 on a permanent basis. The implementation of FIG. 5 includes all of the same elements as the PLD of FIG. 2, which are not again described, but a fuse structure similar to that of FIG. 3 is added. The fuse structure includes elements 506–508, and is coupled between low voltage power supply 204 and program circuit 202. A reverse current connection diode 508 is coupled to low voltage power supply 204, and a fuse 506 is coupled between diode 508 and program circuit 202. A switch 507 is coupled between high voltage power supply 205 and a control terminal of fuse 506, the switch being controlled by a program protect signal PROGRAM PROTECT. Switch 507 can be implemented, for example, using an N-channel transistor or a CMOS pass gate, or using any other method compatible with the fabrication technology of the PLD. Fuse 506 can be implemented, for example, using any of several well-known techniques, such as those currently in use for fuse PLDs, or using other techniques yet to be developed.

FIG. 6 illustrates a PLD in which control signals PCTRL coupling program circuit 202 to memory array 201 can be optionally disconnected on a permanent basis. The implementation of FIG. 6 includes all of the same elements as the PLD of FIG. 2, which are not again described, but a fuse structure similar to that of FIG. 4 is added. The fuse structure includes elements 606–607, and is coupled between program circuit 202 and memory array 201. A switch 607 is coupled between high voltage power supply 205 and a control terminal of fuse 606, the switch being controlled by erase protect signal ERASE PROTECT. Switch 607 can be implemented, for example, using an N-channel transistor or a CMOS pass gate, or using any other method compatible with the fabrication technology of the CPLD. Fuse 606 can be implemented, for example, using any of several well-known techniques, such as those currently in use for fuse PLDs, or using other techniques yet to be developed.

Figure 7:
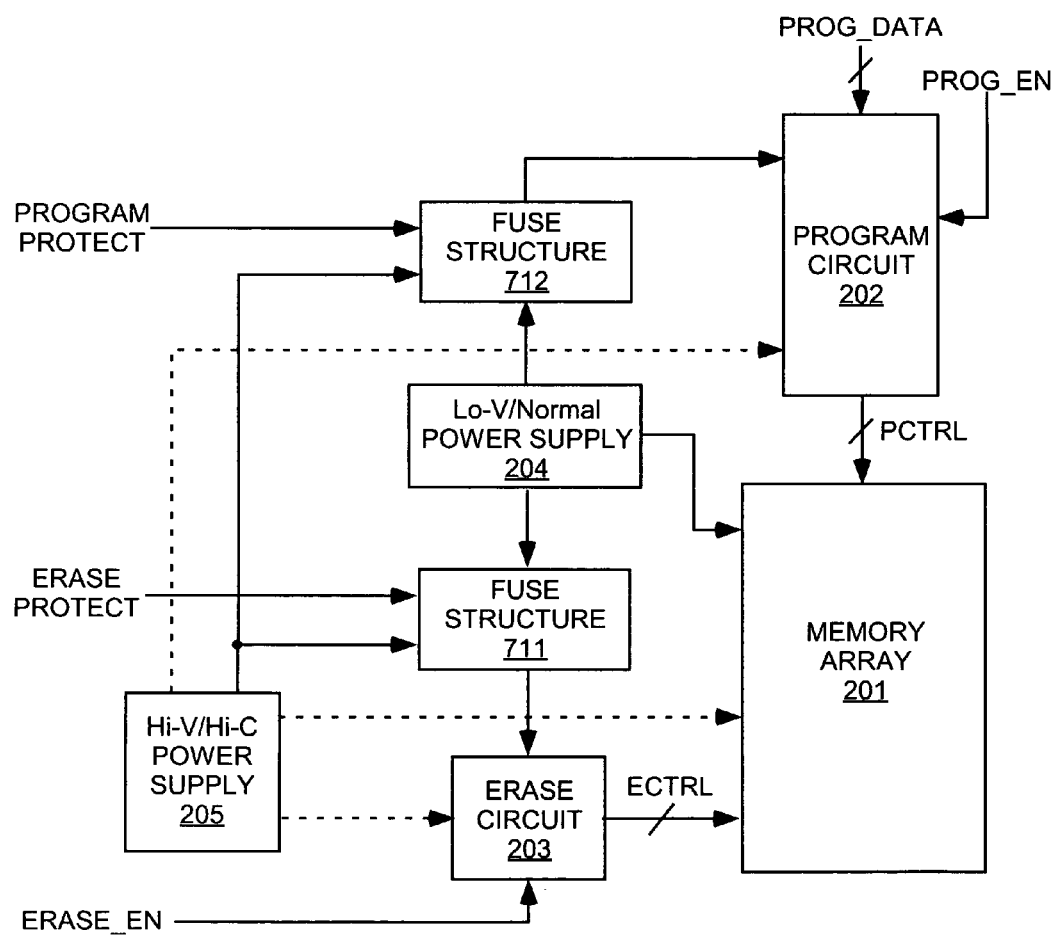
FIG. 7 illustrates a first PLD in which both program and erase functions can be optionally disabled.

FIG. 7 illustrates a first PLD in which both program and erase functions can be optionally disabled. The implementation of FIG. 7 includes all of the same elements as the PLD of FIG. 2, which are not again described, but two fuse structures are added. Fuse structure 711 is coupled between low voltage power supply 204 and erase circuit 203. Fuse structure 711 can be implemented, for example, in the same manner as the fuse structure illustrated in FIG. 3. Fuse structure 712 is coupled between low voltage power supply 204 and program circuit 202. Fuse structure 712 can be implemented, for example, in the same manner as the fuse structure illustrated in FIG. 5.

Figure 8:
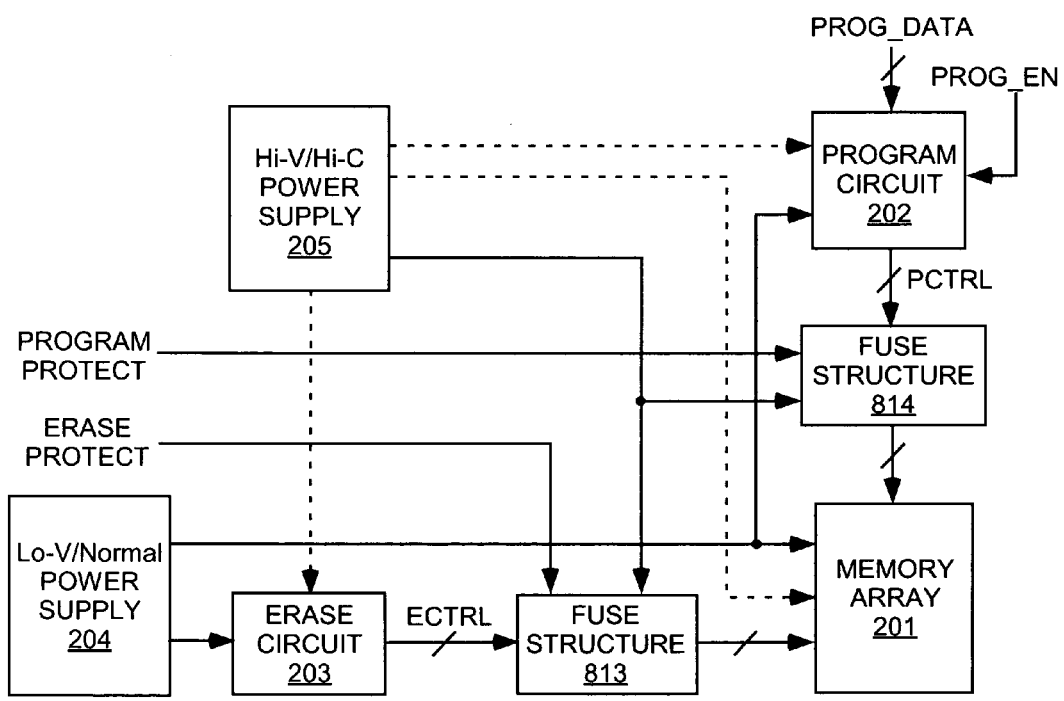
FIG. 8 illustrates a second PLD in which both program and erase functions can be optionally disabled.

FIG. 8 illustrates a second PLD in which both program and erase functions can be optionally disabled. The implementation of FIG. 8 includes all of the same elements as the PLD of FIG. 2, which are not again described, but two fuse structures are added. Fuse structure 813 is coupled between erase circuit 203 and memory array 201. Fuse structure 813 can be implemented, for example, in the same manner as the fuse structure illustrated in FIG. 4. Fuse structure 814 is coupled between program circuit 202 and memory array 201. Fuse structure 814 can be implemented, for example, in the same manner as the fuse structure illustrated in FIG. 6.

Figure 9:
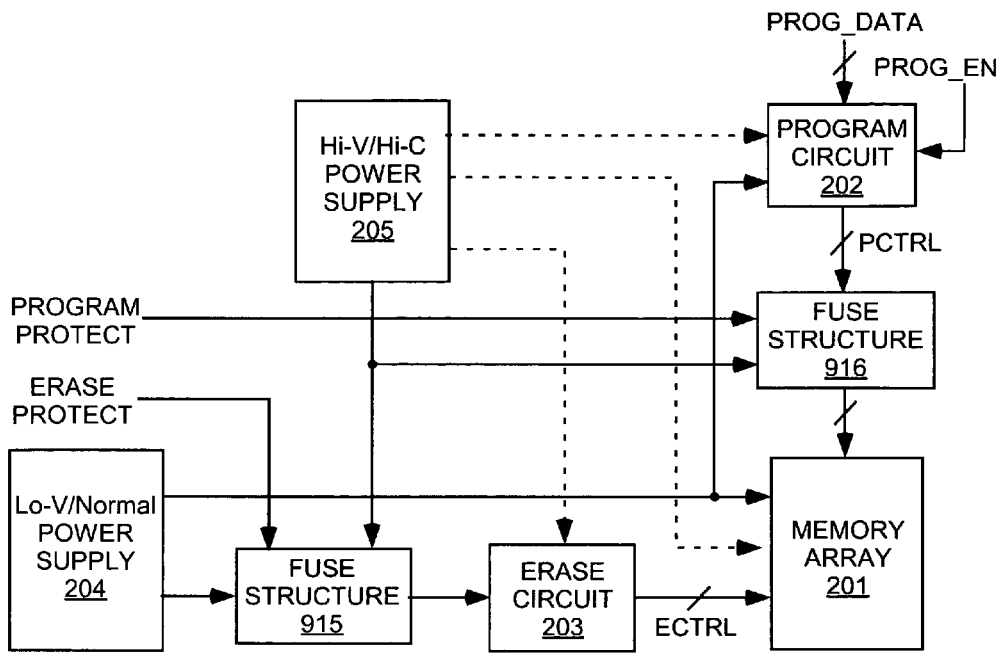
FIG. 9 illustrates a third PLD in which both program and erase functions can be optionally disabled.

FIG. 9 illustrates a third PLD in which both program and erase functions can be optionally disabled. The implementation of FIG. 9 includes all of the same elements as the PLD of FIG. 2, which are not again described, but two fuse structures are added. Fuse structure 915 is coupled between low voltage power supply 204 and erase circuit 203. Fuse structure 915 can be implemented, for example, in the same manner as the fuse structure illustrated in FIG. 3. Fuse structure 916 is coupled between program circuit 202 and memory array 201. Fuse structure 916 can be implemented, for example, in the same manner as the fuse structure illustrated in FIG. 6.

Figure 10:
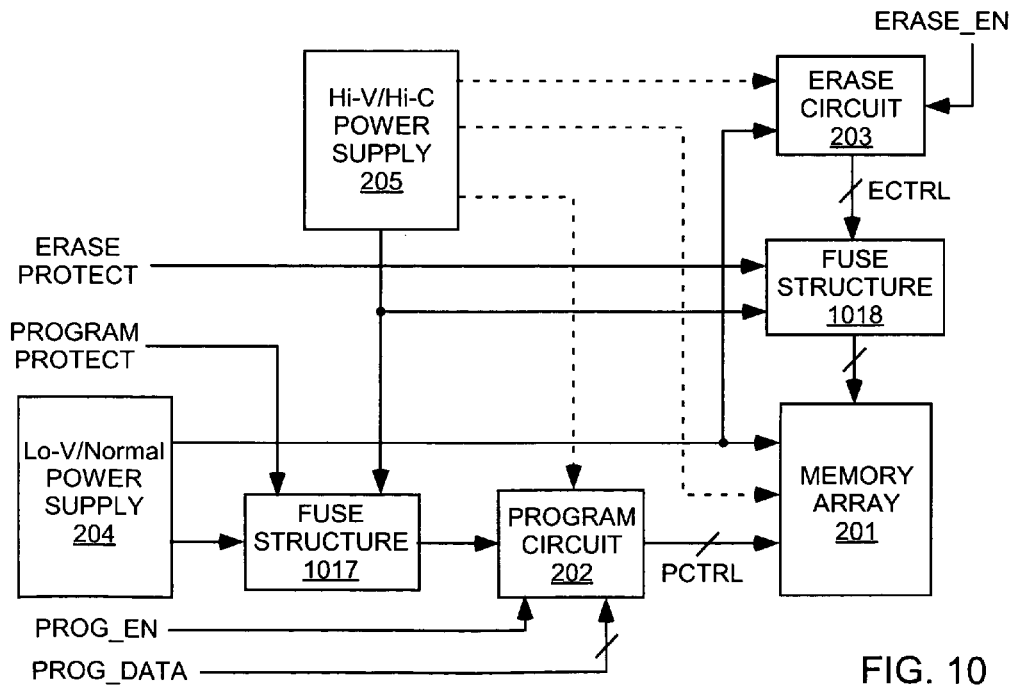
FIG. 10 illustrates a fourth PLD in which both program and erase functions can be optionally disabled.

FIG. 10 illustrates a fourth PLD in which both program and erase functions can be optionally disabled. The implementation of FIG. 10 includes all of the same elements as the PLD of FIG. 2, which are not again described, but two fuse structures are added. Fuse structure 1017 is coupled between low voltage power supply 204 and program circuit 202. Fuse structure 1017 can be implemented, for example, in the same manner as the fuse structure illustrated in FIG. 5. Fuse structure 1018 is coupled between erase circuit 203 and memory array 201. Fuse structure 1018 can be implemented, for example, in the same manner as the fuse structure illustrated in FIG. 4.

Note that in the embodiments of FIGS. 7–10 the erase and program functions can be disabled independently. Either or both of signals ERASE PROTECT and PROGRAM PROTECT can be used to permanently disabled one or both of these functions, as desired. Alternatively, the two signals ERASE PROTECT and PROGRAM PROTECT can be coupled together, and both functions can be disabled using a single input signal.

Further note that in the embodiments of FIGS. 3–10 the same high voltage power supply used to program and erase the memory array is also used to blow the fuses. This implementation is preferred, because it eliminates the need for a second source of high current to blow the fuses. However, in some embodiments (not shown) a high current source other than the high voltage power supply 205 is used to blow the fuses.

In some embodiments, the fuse structures illustrated in FIGS. 7–10 include multiple fuses, to further reduce the possibility of reconnecting the two sides of the fuse structure in some unanticipated manner. In some embodiments (not shown), fuse structures are included both between the low voltage power supply and the erase/program circuit, and between the erase/program circuit and the memory array. These embodiments provide additional security for the user. Additionally or alternatively, the features described above can also be used in conjunction with other security features, e.g., encoded programming data, to yet further increase security. It will be apparent to one skilled in the art after reading this specification that the present invention can be practiced within these and other architectural variations.

Figure 11:
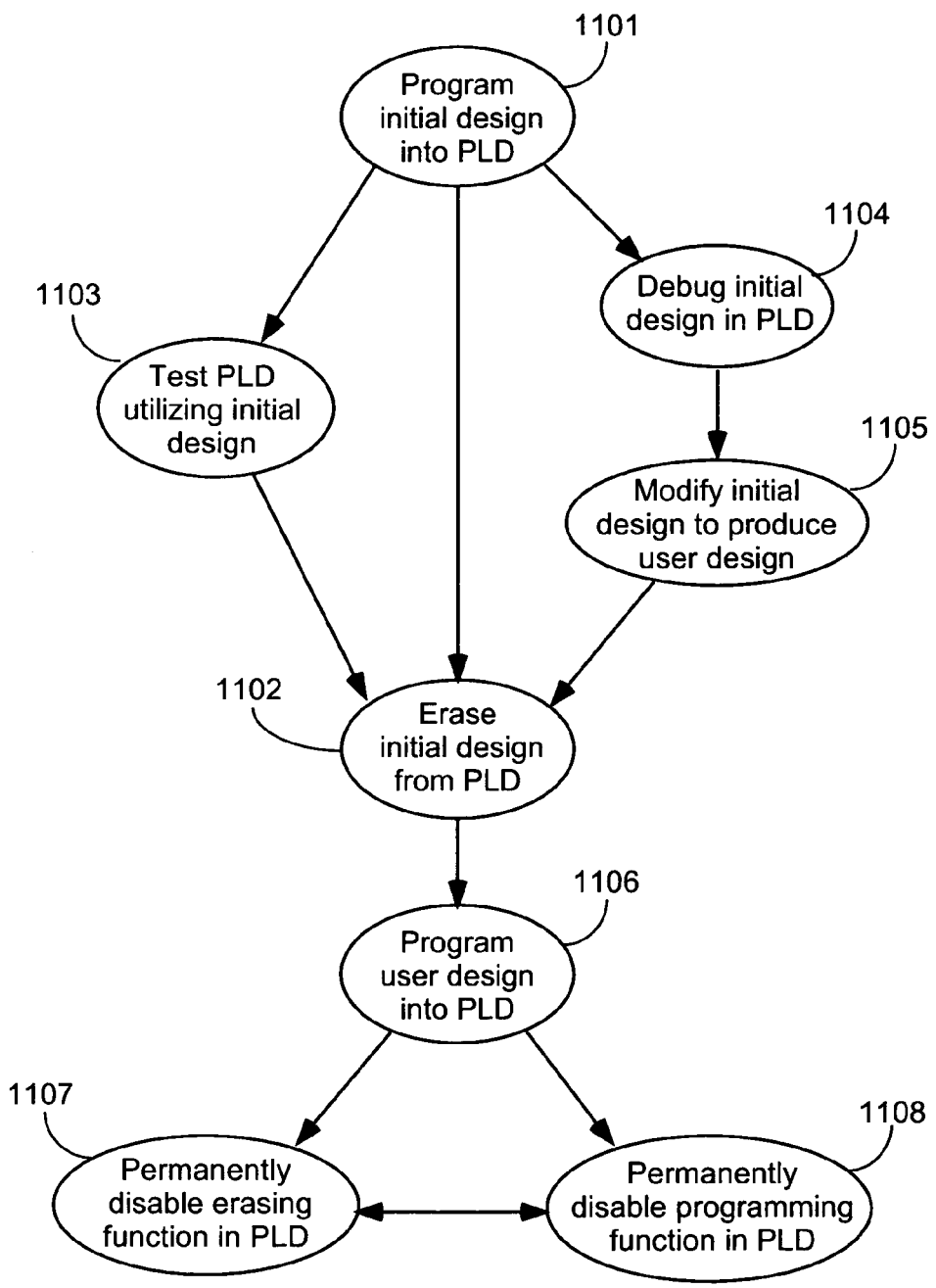
FIG. 11 illustrates exemplary steps that can be taken to convert a PLD to an OTP device.

FIG. 11 illustrates exemplary steps that can be taken to convert a PLD to an OTP device. In step 1101, an initial design is programmed into the PLD. In step 1102, the initial design is erased from the PLD. Various steps can occur between steps 1101 and 1102. For example, where the initial design is a test design (e.g., used to verify functionality of the PLD after fabrication and/or packaging), the PLD can be tested utilizing the initial design (step 1103). As another example, where the initial design is an early version of a user design, the initial design can be debugged (step 1104), and the initial design can be modified as many times as necessary to produce a final user design (step 1105).

After erasing the initial design from the PLD (step 1102), a second design (the "user design") is programmed into the PLD (step 1106). At this point, the erasing function can be permanently disabled (step 1107), or the programming function can be permanently disabled (step 1108), or both functions can be disabled at the same time or in sequence. Note also that the PLD can simply be maintained indefinitely as a reprogrammable device, being erased and reprogrammed as many times as desired. It is not necessary ever to convert the PLD to an OTP device.

One benefit of the circuits and methods of the invention is that they enable the use of partially defective PLDs in OTP applications. For example, if a PLD based on non-volatile memory storage is found to include a single defective logic element, the PLD can simply be programmed with a useful design that does not utilize the defective logic element, and the PLD can be converted to an OTP device on a permanent basis. No functionality is lost, yet the newly OTP device can potentially be sold at a reduced cost. This alternative benefits both the user and the manufacturer, who might otherwise have to discard the device altogether.

Those having skill in the relevant arts of the invention will now perceive various modifications and additions that can be made as a result of the disclosure herein. For example, the above text describes the circuits of the invention in the context of complex programmable logic devices (CPLDs). However, the circuits of the invention can also be implemented in other programmable logic devices (PLDs) in which programming data is stored in non-volatile memory.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A programmable logic device (PLD) convertible to a one-time programmable (OTP) device, the PLD comprising:
   a non-volatile memory array;
   an erase circuit coupled to the memory array;
   a program circuit coupled to the memory array;
   a low voltage power supply coupled to the memory array, the erase circuit, and the program circuit;
   a high voltage power supply coupled to at least one of the memory array, the erase circuit, and the program circuit; and
   a first fuse structure coupled between the low voltage power supply and the erase circuit.

2. The PLD of claim 1, wherein the first fuse structure is further coupled to the high voltage power supply.

3. The PLD of claim 1, wherein the first fuse structure comprises a reverse current protection diode coupled to the low voltage power supply and a fuse coupled between the diode and the erase circuit.

4. The PLD of claim 3, further comprising a switch coupled between the fuse and the high voltage power supply, the switch having a control terminal coupled to an erase protect input terminal.

5. The PLD of claim 1, further comprising a second fuse structure coupled between the low voltage power supply and the program circuit.

6. The PLD of claim 5, wherein the second fuse structure comprises a control terminal coupled to the high voltage power supply.

7. The PLD of claim 1, further comprising a second fuse structure coupled between the program circuit and the non-volatile memory array.

8. The PLD of claim 7, wherein the second fuse structure comprises a control terminal coupled to the high voltage power supply.

9. The PLD of claim 1, wherein the PLD is a complex programmable logic device (CPLD).

10. A programmable logic device (PLD) convertible to a one-time programmable (OTP) device, the PLD comprising:
    a non-volatile memory array;
    an erase circuit coupled to the memory array;
    a program circuit coupled to the memory array;
    a low voltage power supply coupled to the memory array, the erase circuit, and the program circuit;
    a high voltage power supply coupled to at least one of the memory array, the erase circuit, and the program circuit; and
    a first fuse structure coupled between the erase circuit and the memory array.

11. The PLD of claim 10, wherein the first fuse structure is further coupled to the high voltage power supply.

12. The PLD of claim 10, wherein the first fuse structure comprises a fuse coupled between the erase circuit and the memory array.

13. The PLD of claim 12, further comprising a switch coupled between the fuse and the high voltage power supply, the switch comprising a control terminal coupled to an erase protect input terminal.

14. The PLD of claim 10, further comprising a second fuse structure coupled between the low voltage power supply and the program circuit.

15. The PLD of claim 14, wherein the second fuse structure comprises a control terminal coupled to the high voltage power supply.

16. The PLD of claim 10, further comprising a second fuse structure coupled between the program circuit and the non-volatile memory array.

17. The PLD of claim 16, wherein the second fuse structure comprises a control terminal coupled to the high voltage power supply.

18. The PLD of claim 10, wherein the PLD is a complex programmable logic device (CPLD).

19. A programmable logic device (PLD) convertible to a one-time programmable (OTP) device, the PLD comprising:
    a non-volatile memory array;
    an erase circuit coupled to the memory array;
    a program circuit coupled to the memory array;
    a low voltage power supply coupled to the memory array, the erase circuit, and the program circuit;
    a high voltage power supply coupled to at least one of the memory array, the erase circuit, and the program circuit; and
    a fuse structure coupled between the low voltage power supply and the program circuit.

20. The PLD of claim 19, wherein the first fuse structure is further coupled to the high voltage power supply.

21. The PLD of claim 19, wherein the fuse structure comprises a reverse current protection diode coupled to the low voltage power supply and a fuse coupled between the diode and the program circuit.

22. The PLD of claim 21, further comprising a switch coupled between the fuse and the high voltage power supply, the switch comprising a control terminal coupled to a program protect input terminal.

23. The PLD of claim 19, wherein the PLD is a complex programmable logic device (CPLD).

24. A programmable logic device (PLD) convertible to a one-time programmable (OTP) device, the PLD comprising:
    a non-volatile memory array;
    an erase circuit coupled to the memory array;
    a program circuit coupled to the memory array;
    a low voltage power supply coupled to the memory array, the erase circuit, and the program circuit;
    a high voltage power supply coupled to at least one of the memory array, the erase circuit, and the program circuit; and
    a fuse structure coupled between the program circuit and the memory array,
    wherein blowing at least one fuse in the fuse structure physically destroys an electrical connection between the program circuit and the memory array.

25. The PLD of claim 24, wherein the first fuse structure is further coupled to the high voltage power supply.

26. The PLD of claim 24, wherein the fuse structure comprises a fuse coupled between the program circuit and the memory array.

27. The PLD of claim 24, further comprising a switch coupled between the fuse and the high voltage power supply, the switch comprising a control terminal coupled to a program protect input terminal.

28. The PLD of claim 24, wherein the PLD is a complex programmable logic device (CPLD).

29. A programmable logic device (PLD) convertible to a one-time programmable (OTP) device, the PLD comprising:
    a non-volatile memory array;
    an erase circuit coupled to the memory array;
    a program circuit coupled to the memory array;
    a low voltage power supply coupled to the memory array, the erase circuit, and the program circuit;
    a high voltage power supply coupled to at least one of the memory array, the erase circuit, and the program circuit; and
    means for permanently decoupling the low voltage power supply from the erase circuit.

30. A programmable logic device (PLD) convertible to a one-time programmable (OTP) device, the PLD comprising:
- a non-volatile memory array;
- an erase circuit coupled to the memory array;
- a program circuit coupled to the memory array;
- a low voltage power supply coupled to the memory array, the erase circuit, and the program circuit;
- a high voltage power supply coupled to at least one of the memory array, the erase circuit, and the program circuit; and
- means for permanently decoupling the erase circuit from the memory array.

31. A programmable logic device (PLD) convertible to a one-time programmable (OTP) device, the PLD comprising:
- a non-volatile memory array;
- an erase circuit coupled to the memory array;
- a program circuit coupled to the memory array;
- a low voltage power supply coupled to the memory array, the erase circuit, and the program circuit;
- a high voltage power supply coupled to at least one of the memory array, the erase circuit, and the program circuit; and
- means for permanently decoupling the low voltage power supply from the program circuit.

32. A programmable logic device (PLD) convertible to a one-time programmable (OTP) device, the PLD comprising:
- a non-volatile memory array;
- an erase circuit coupled to the memory array;
- a program circuit coupled to the memory array;
- a low voltage power supply coupled to the memory array, the erase circuit, and the program circuit;
- a high voltage power supply coupled to at least one of the memory array, the erase circuit, and the program circuit; and
- means for permanently decoupling the program circuit from the memory array.

* * * * *